(12) United States Patent
Keskar

(10) Patent No.: US 11,569,726 B2
(45) Date of Patent: Jan. 31, 2023

(54) HYBRID GATE DRIVER

(71) Applicant: TEXAS INSTRUMENTS INCORPORATED, Dallas, TX (US)

(72) Inventor: Neeraj A. Keskar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 315 days.

(21) Appl. No.: 16/874,837

(22) Filed: May 15, 2020

(65) Prior Publication Data

US 2021/0359674 A1 Nov. 18, 2021

(51) Int. Cl.
| | |
|---|---|
| *H02M 1/08* | (2006.01) |
| *H02M 3/156* | (2006.01) |
| *H03K 17/567* | (2006.01) |
| *H02M 1/00* | (2006.01) |

(52) U.S. Cl.
CPC ............. *H02M 1/08* (2013.01); *H02M 3/156* (2013.01); *H02M 1/0006* (2021.05); *H03K 17/567* (2013.01)

(58) Field of Classification Search
CPC .................. G05F 1/00; G05F 1/10; G05F 1/12
See application file for complete search history.

(56) References Cited

U.S. PATENT DOCUMENTS

| 4,200,822 A * | 4/1980 | Miller .................... G09G 3/294 345/208 |
| 8,796,966 B2 * | 8/2014 | Peto ........................ H02P 23/26 318/729 |
| 2012/0032714 A1* | 2/2012 | Shimazaki ....... H03K 17/04123 327/109 |

FOREIGN PATENT DOCUMENTS

WO   WO-2018051084 A1 *   3/2018   .............. H02M 1/08

\* cited by examiner

*Primary Examiner* — Adolf D Berhane
*Assistant Examiner* — Afework S Demisse
(74) *Attorney, Agent, or Firm* — Ray A. King; Frank D. Cimino

(57) ABSTRACT

A hybrid gate driver circuit includes a field effect transistor (FET) drive terminal, a switching node terminal, a transistor, and a capacitor. The transistor includes a first terminal coupled to the FET drive terminal, and a second terminal coupled to ground. The capacitor includes a first terminal coupled to the switching node terminal, and a second terminal coupled to a third terminal of the transistor.

17 Claims, 5 Drawing Sheets

HYBRID GATE DRIVER

BACKGROUND

A switch-mode power supply is an electronic circuit that converts an input direct current (DC) supply voltage into one or more DC output voltages that are higher or lower in magnitude than the input DC supply voltage. A switch-mode power supply that generates an output voltage lower than the input voltage is termed a buck or step-down converter. A switch-mode power supply that generates an output voltage higher than the input voltage is termed a boost or step-up converter.

Some switch-mode power supply topologies include a drive/power transistor coupled at a switch node to an energy storage inductor/transformer. Electrical energy is transferred through the energy storage inductor/transformer to a load by alternately opening and closing the switch as a function of a switching signal. The amount of electrical energy transferred to the load is a function of the ON/OFF duty cycle of the switch and the frequency of the switching signal. Switch-mode power supplies are widely used to power electronic devices, particularly battery powered devices, such as portable cellular phones, laptop computers, and other electronic systems in which efficient use of power is desirable.

In order to reduce switching losses in power transistors, the power transistors must be switched on and off very rapidly. Because the power transistor's control terminal may present significant capacitance, a gate driver circuit may be employed to buffer an input signal and drive the power transistor's control terminal. The gate driver circuit receives a low-power input signal and buffers the input signal to produce a high-current signal that quickly charges or discharges the input capacitance of the power transistor. Examples of power transistors with which a gate driver circuit may be employed include insulated gate bipolar transistors and metal oxide semiconductor field-effect-transistors.

SUMMARY

A hybrid gate driver circuit that controls the low-side power transistor of a switch-mode power supply based on the slew rate of voltage at the switching node of the power supply is disclosed herein. In one example, a hybrid gate driver circuit includes a field effect transistor (FET) drive terminal, a switching node terminal, a transistor, and a capacitor. The transistor includes a first terminal coupled to the FET drive terminal, and a second terminal coupled to ground. The capacitor includes a first terminal coupled to the switching node terminal, and a second terminal coupled to a third terminal of the transistor.

In another example, a switch-mode power supply circuit includes a switching node, a low-side field effect transistor (FET), and a hybrid gate driver circuit. The low-side power FET includes a first terminal coupled to the switching node, and a second terminal coupled to ground. The hybrid gate driver circuit is configured to control activation of the low-side power FET based on a pulse width modulation signal and a slew rate of signal at the switching node.

In a further example, a method for driving a low-side power transistor in a switch-mode power supply includes turning off the low-side power transistor and turning on a high-side power transistor. A pulse is generated based on a slew rate of signal at a switching node of the switch-mode power supply. The pulse is applied to turn on a first transistor that holds the low-side power transistor off.

BRIEF DESCRIPTION OF THE DRAWINGS

For a detailed description of various examples, reference will now be made to the accompanying drawings in which.

DETAILED DESCRIPTION

In a switch-mode power supply, such as a DC-DC converter, the power transistors (e.g., field effect transistors (FETs)) are selected for fast switching with reduced switching power loss. The gate driver circuits that activate the power transistors provide a low output resistance to ensure fast switching of the power transistors. With the parasitic inductance and capacitance of the packaging of power supply components and the circuit boards on which the packages are mounted, fast switching of the power transistors can create significant noise (power supply noise) at the integrated circuit power terminals, which results in a transient drop in power supply voltage. A reduction in power supply voltage causes the resistance of the gate drivers to increase. When the output switching node of the switch-mode power supply rises coincidentally with the drop in the power supply voltage provided to the gate driver circuit, capacitive coupling through the drain-gate capacitance of the low-side power transistor can cause the low-side power transistor to turn on and provide a conduction path from the output switching node to ground, which produces ground noise, reduces power supply efficiency, and can damage the low-side and/or the high-side power transistors.

Figure 1:
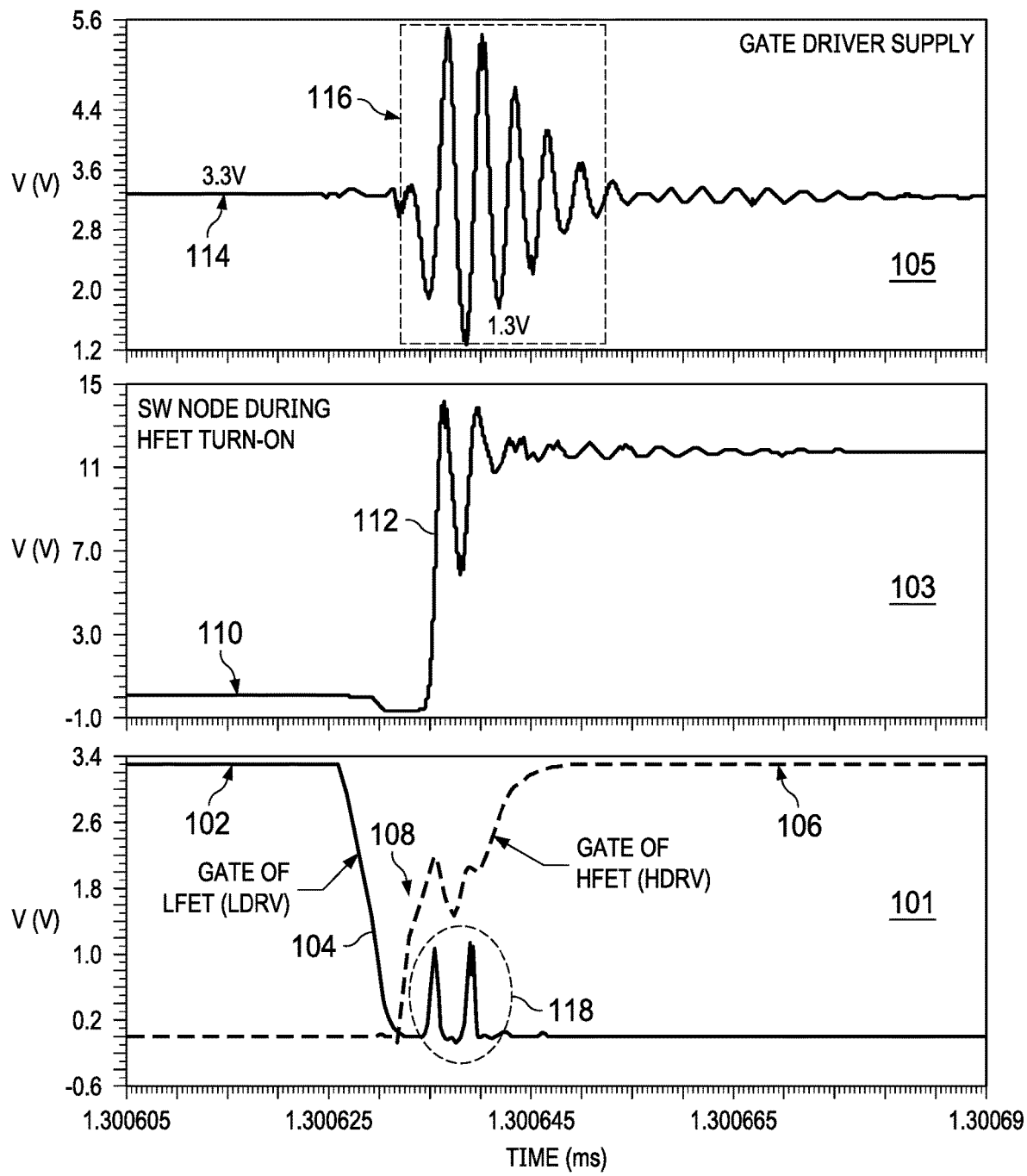
FIG. 1 shows an example of transients on a low-side field effect transistor (FET) drive signal caused by power supply noise.

FIG. 1 shows an example of transients on a low-side power transistor gate drive signal caused by power supply noise. FIG. 1 shows the low-side power transistor gate drive signal 102 and the high-side power transistor gate drive signal 106 in graph 101, the switching node voltage 110 in graph 103, and the power supply voltage 114 in graph 105. The power supply voltage 114 may be 3.3.volts or another relatively low voltage.

At falling edge 104, the low-side power transistor gate drive signal 102 is deactivated to turn off the low-side power transistor before the high-side power transistor is turned on. At 108, the high-side power transistor gate drive signal 106 is activated to turn on the high-side power transistor. Responsive to turning off the high-side power transistor, the switching node voltage 110 transitions at rising edge 112 and noise 116 is induced on the power supply voltage 114. Reduction of the power supply voltage 114 caused by the noise 116 reduces the resistance of the low-side gate driver circuit, and noise (transients) 118 arise on the low-side power transistor gate drive signal 102. The noise 116 may be large enough to turn on the low-side power transistor, which connects the output switching node to ground causing a large, and potentially damaging, current to flow in both the low-side and high-side power transistors.

Some gate driver circuits include large pull-down transistors in an attempt to maintain low output resistance when power supply voltage is reduced. The large transistors may provide limited benefit in maintaining low output resistance, but require substantial increase in circuit size.

The hybrid gate driver circuits described herein provide low resistance pull down to the low-side power transistor by monitoring the slew rate of voltage at the output switching node, and reducing gate driver circuit output resistance in correspondence to the slew rate. Gate drive strength is adjusted as needed based on the slew rate independent of the power supply voltage provided to the gate driver circuit, and is therefore insensitive to noise induced power supply voltage transients. The hybrid gate driver circuits provide low resistance pull down without adding large pull-down transistors, which reduces circuit size relative of other gate driver circuit implementations.

Figure 2:
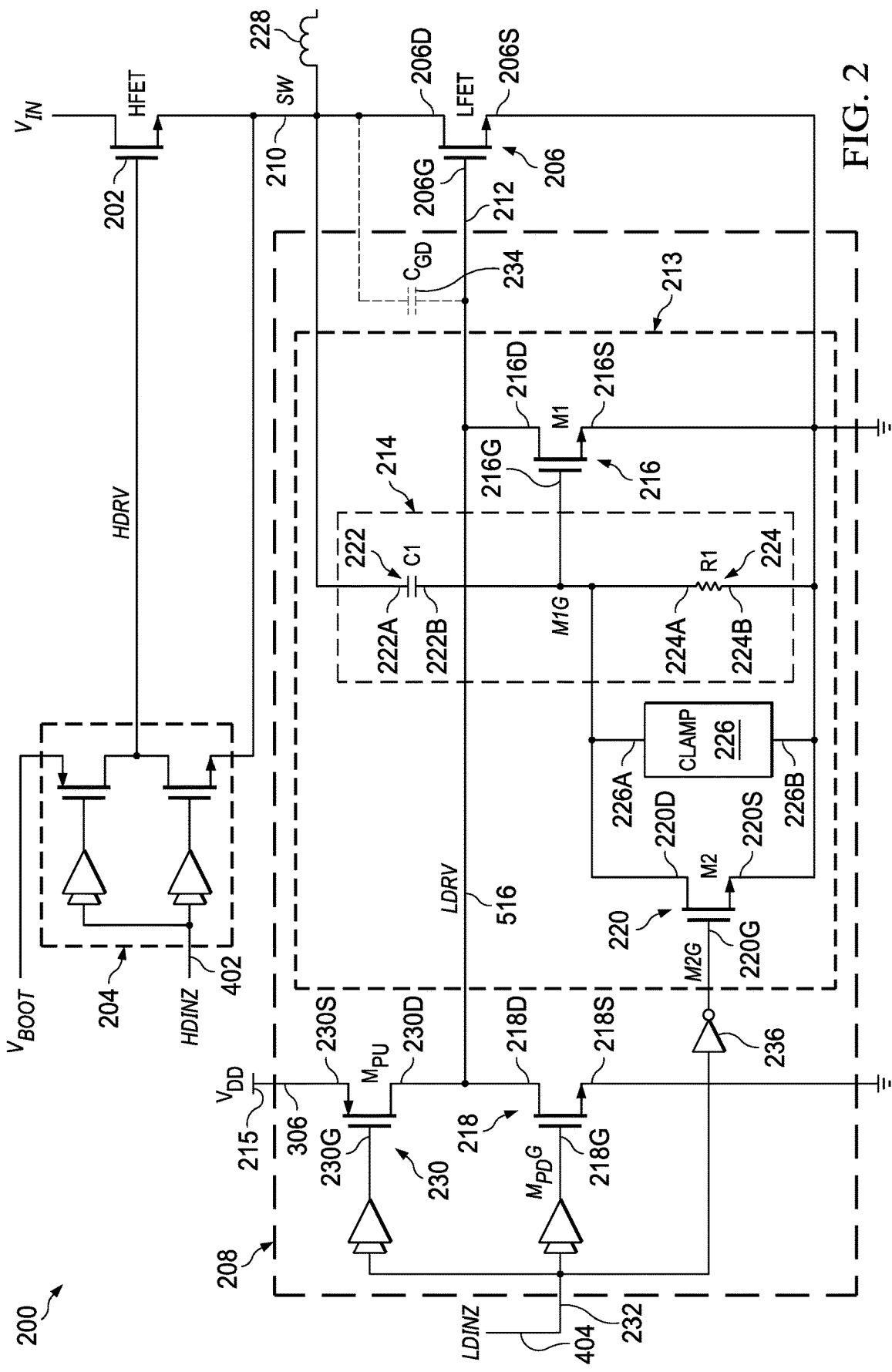
FIG. 2 shows a schematic level diagram for an example switch-mode power supply that includes a hybrid gate driver circuit as described herein.

FIG. 2 shows a schematic level diagram for an example switch-mode power supply 200 that includes a hybrid gate driver circuit as described herein. The switch-mode power supply 200 is illustrated as a step-down (buck) converter, but implementations of the hybrid gate driver circuit are applicable to other topologies, such as step-up (boost) converters. The switch-mode power supply 200 includes a high-side power transistor 202, a high-side gate driver circuit 204, a low-side power transistor 206, and a hybrid gate driver circuit 208. The switch-mode power supply 200 may include addition components that have been omitted from FIG. 2 in the interest of clarity. For example, the switch-mode power supply 200 may include a control circuit including a pulse width modulator that controls switching of the high-side power transistor 202 and the low-side power transistor 206 to maintain a selected voltage at an output of the switch-mode power supply 200.

In operation, the high-side power transistor 202 and the low-side power transistor 206 are alternately activated to charge and discharge an inductor 228 coupled to a switching node 210. The high-side power transistor 202 is activated to connect the inductor 228 to a voltage source ($V_{IN}$) for charging. The low-side power transistor 206 is activated to connect the inductor 228 to ground for discharging. The high-side gate driver circuit 204 generates a drive signal (HDRV) having voltage $V_{BOOT}$ to drive the gate of the high-side power transistor 202 to activate and deactivate the high-side power transistor 202. $V_{BOOT}$ is greater than $V_{IN}$ to turn on the transistor 202. For example, $V_{IN}$ may be 12 volts and $V_{BOOT}$ may be 15 volts. An input terminal of the high-side gate driver circuit 204 may be coupled to a pulse width modulator or other control circuit (not pictured) that generates a pulse width modulation signal (HDINZ) for activating and deactivating the high-side power transistor 202. The hybrid gate driver circuit 208 generates a drive signal (LDRV) to drive the gate of the low-side power transistor 206 to activate and deactivate the low-side power transistor 206. An input terminal 232 (pulse width modulation input terminal) of the high-side gate driver circuit 204 may be coupled to the pulse width modulator or other control circuit that generates a pulse width modulator signal (LDINZ) for activating and deactivating the low-side power transistor 206. A FET drive terminal 212 of the hybrid gate driver circuit 208 is coupled to the gate terminal 206G of the low-side power transistor 206. A source terminal 206S of the low-side power transistor 206 is coupled to ground. A drain terminal 206D of the low-side power transistor 206 is coupled to the switching node 210.

The hybrid gate driver circuit 208 includes a pull-up transistor 230 and a pull-down transistor 218. The pull-up transistor 230 is activated to turn-on the low-side power transistor 206 responsive to a pulse width modulation signal received via the input terminal 232. The pull-up transistor 230 includes a source terminal 230S coupled to a power supply terminal 215 ($V_{DD}$), a drain terminal coupled to the gate terminal 206G of the low-side power transistor 206, and a gate terminal 230G coupled to the input terminal 232. $V_{DD}$ may be a relatively low voltage, such as 3.3 volts. The pull-down transistor 218 is activated to turn off the low-side power transistor 206 responsive to the pulse width modulation signal. The transistor 218 includes a drain terminal 218D coupled to the gate terminal 206G of the low-side power transistor 206, a source terminal 218S coupled to a ground terminal, and a gate terminal 218G coupled to the input terminal 232.

The hybrid gate driver circuit 208 also includes circuitry 213 that mitigates the effects of power supply noise and noise caused by switching at the switching node 210 on the low-side transistor gate drive signal LDRV. The circuitry 213 includes a transistor 216, a slew rate monitoring circuit 214, a transistor 220, and a clamp circuit 226. The transistor 216 pulls down the gate terminal 206G of the low-side power transistor 206 responsive to a control signal generated by the slew rate monitoring circuit 214. The transistor 216 includes a drain terminal 216D coupled to the FET drive terminal 212, a source terminal 216S coupled to ground, and a gate terminal 216G coupled to the slew rate monitoring circuit 214.

The slew rate monitoring circuit 214 monitors the voltage at the switching node 210, and generates a control signal to activate the pull-down transistor 218 based on the slew rate of the voltage at the switching node 210. The slew rate monitoring circuit 214 includes a capacitor 222 and a resistor 224. The capacitor 222 includes a terminal 222A coupled to the switching node 210 and a terminal 222B coupled to the gate terminal 216G of the transistor 216. The resistor 224 includes a terminal 224B coupled to ground, and a terminal 224A coupled to the terminal 222B of the capacitor 222 and the gate terminal 216G of the transistor 216. When the high-side power transistor 202 is activated, creating a rising edge at the switching node 210, a voltage is developed across the resistor 224 via the capacitor 222. The voltage developed across the resistor 224 is a function of the slew rate of the rising edge at the switching node 210. Higher slew rates at the switching node 210 produce a higher voltage across the resistor 224 and at the gate terminal 216G of the transistor 216. Thus, the transistor 216 is activated to pull down the FET drive terminal 212 and the gate terminal 206G of the low-side power transistor 206 based on the slew rate of the signal at the switching node 210.

The clamp circuit 226 ensures that the voltage across the resistor 224 is limited to a predetermined range (e.g., the voltage of the power supply powering the hybrid gate driver circuit 208). The clamp circuit 226 includes a terminal 226A coupled to the terminal 224A of the resistor 224, and a terminal 226B coupled to ground. The clamp circuit 226 may be implemented using a Zener diode, a $V_{GS}$ clamping circuit, an active clamping circuit, or other clamping circuit.

The transistor 220 controls operation of the transistor 216 based on the state of the pulse width modulation signal received at the input terminal 232. The transistor 220 enables operation of the transistor 216 when the pulse modulation signal received at the input terminal 232 has a state intended to activate the pull-down transistor 218 (i.e., to pull down the gate terminal 206G of the low-side power transistor 206). The transistor 220 disables operation of the transistor 216, by pulling the gate terminal 216G of the transistor 216 to ground, when the pulse modulation signal received at the input terminal 232 has a state intended to deactivate the pull-down transistor 218 (i.e., to pull up the gate terminal 206G of the low-side power transistor 206). Thus, the transistor 220 enables the transistor 216 to pull down the gate terminal 206G of the low-side power transistor 206 only when the pulse modulation signal received at the input terminal 232 indicates that the gate terminal 206G of the low-side power transistor 206 is to be pulled down. A drain terminal 220D of the transistor 220 is coupled to the gate terminal 216G of the transistor 216. A source terminal 220S of the transistor 220 is coupled to ground. A gate terminal 220G of the transistor 220 is coupled to the input terminal 232 via an inverter 236.

The high-side power transistor 202, the high-side gate driver circuit 204, the transistor 216, the pull-down transistor 218, and the transistor 220 may be N-channel metal oxide semiconductor field effect transistors (MOSFETs). The pull-up transistor 230 may be a P-channel MOSFET.

Figure 3:
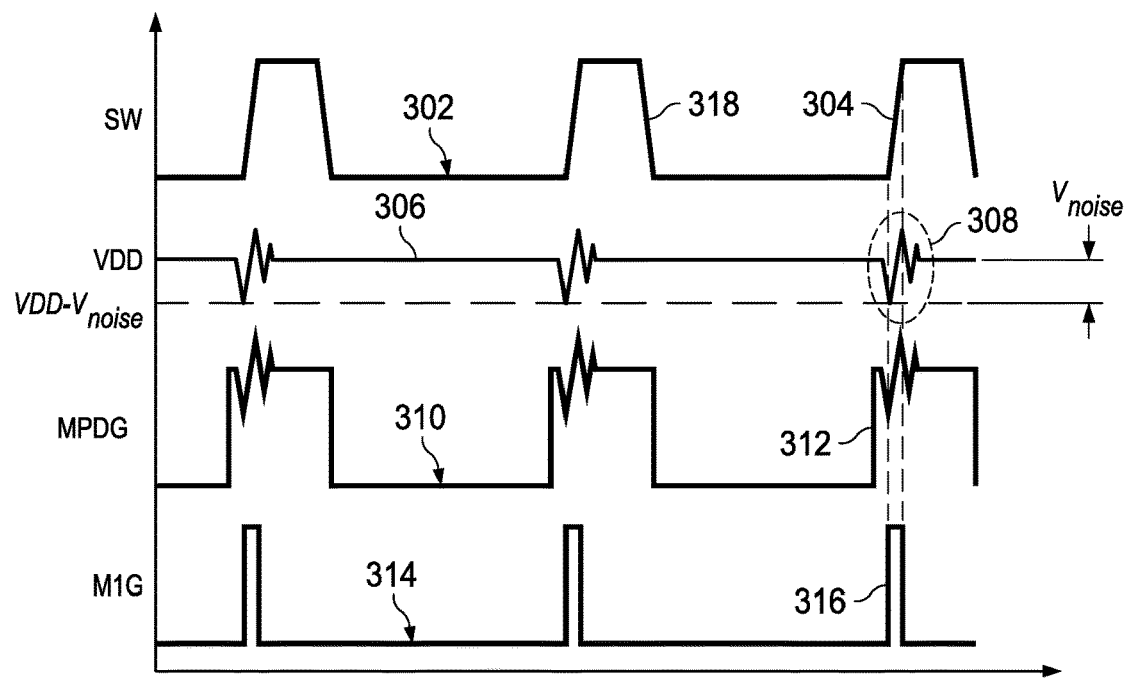
FIG. 3 shows an example of signals in a hybrid gate driver circuit as described herein.

FIG. 3 shows an example of signals in the hybrid gate driver circuit 208 as described herein. FIG. 3 shows the signal 302 at the switching node 210, the power supply voltage 306 that powers the hybrid gate driver circuit 208, the signal 310 at the gate terminal 218G of the pull-down transistor 218, and the signal 314 at the gate terminal 216G of the transistor 216. When the high-side power transistor 202 is activated, the signal 302 rises at edge 304. Switching of the high-side power transistor 202 induces noise 308 on the power supply voltage 306. The noise 308 causes the voltage of the power supply voltage 306 to drop. The noise on the power supply voltage 306 reduces the voltage at the gate terminal 218G of the pull-down transistor 218, which increases the resistance of the pull-down transistor 218 making the low-side power transistor 206 more susceptible to activation via the drain-gate capacitance 234 thereof.

Transition of the signal 302 at edge 304 induces pulse 316 on the signal 314. The pulse 316 activates the transistor 216, which lowers the pull-down resistance at the gate terminal 206G of the low-side power transistor 206 and prevents the low-side power transistor 206 from activating. Falling edge 318 of the signal 302 does not trigger the hybrid gate driver circuit 208 to activate the transistor 216 because the voltage at the terminal 222B of the capacitor 222 falls responsive to the falling edge 318 of the signal 302.

Figure 4:
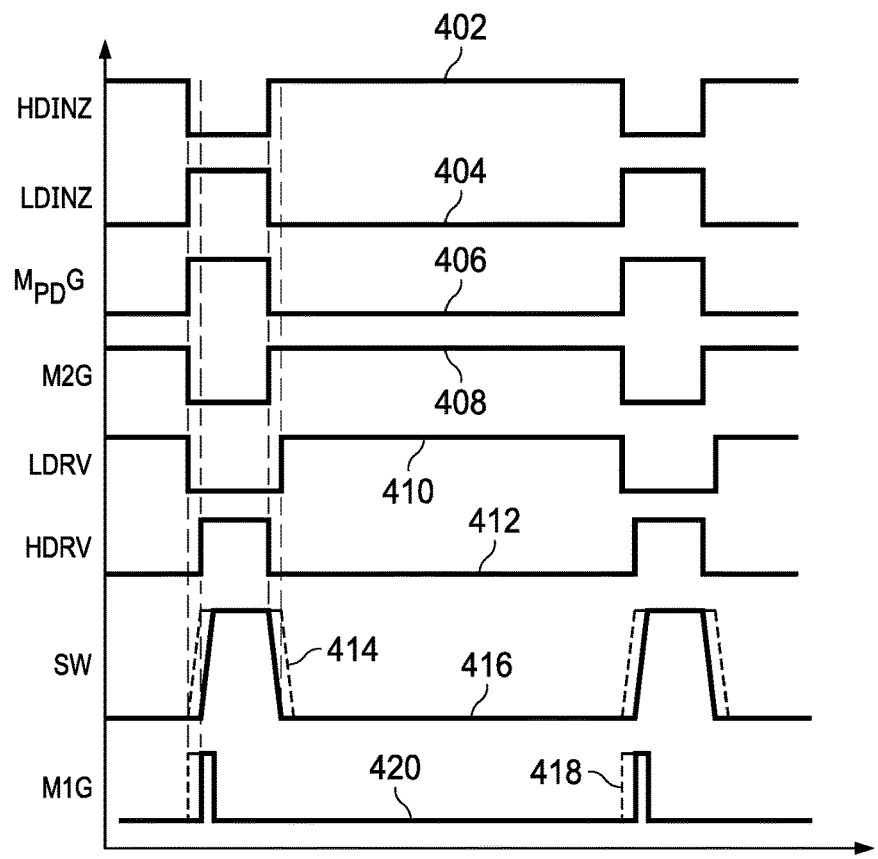
FIG. 4 shows an example of signals in a hybrid gate driver circuit as described herein.

FIG. 4 shows an example of signals in the hybrid gate driver circuit 208 with positive and negative current flow in the inductor 228. FIG. 4 shows a high-side pulse width modulation signal 402 (also shown in FIG. 2 as input HDINZ to the high-side gate driver circuit 204), a low-side pulse width modulation signal 404 (also shown in FIG. 2 as input LDINZ to the hybrid gate driver circuit 208), a signal 406 at the gate terminal 218G of the pull-down transistor 218, a signal 408 at the gate terminal 220G of the transistor 220, a signal 410 at the gate terminal 206G of the low-side power transistor 206, and a signal 412 at the gate of the high-side power transistor 202. With positive current flowing in the inductor 228, signal 416 at the switching node 210 transitions responsive to activation of the high-side power transistor 202 by the signal 412, and the signal 420 at the gate terminal 216G of the transistor 216 is generated in the hybrid gate driver circuit 208 to inhibit activation of the low-side power transistor 206. With negative current flowing in the inductor 228, a signal 414 at the switching node 210 transitions responsive to deactivation of the low-side power transistor 206 by the signal 410, and the signal 418 at the gate terminal 216G of the transistor 216 is generated in the hybrid gate driver circuit 208 to inhibit activation of the low-side power transistor 206. Thus, the hybrid gate driver circuit 208 inhibits activation of the low-side power transistor 206 based on the slew rate of signal at the 410 for both positive and negative current flow in the inductor 228.

Figure 5:
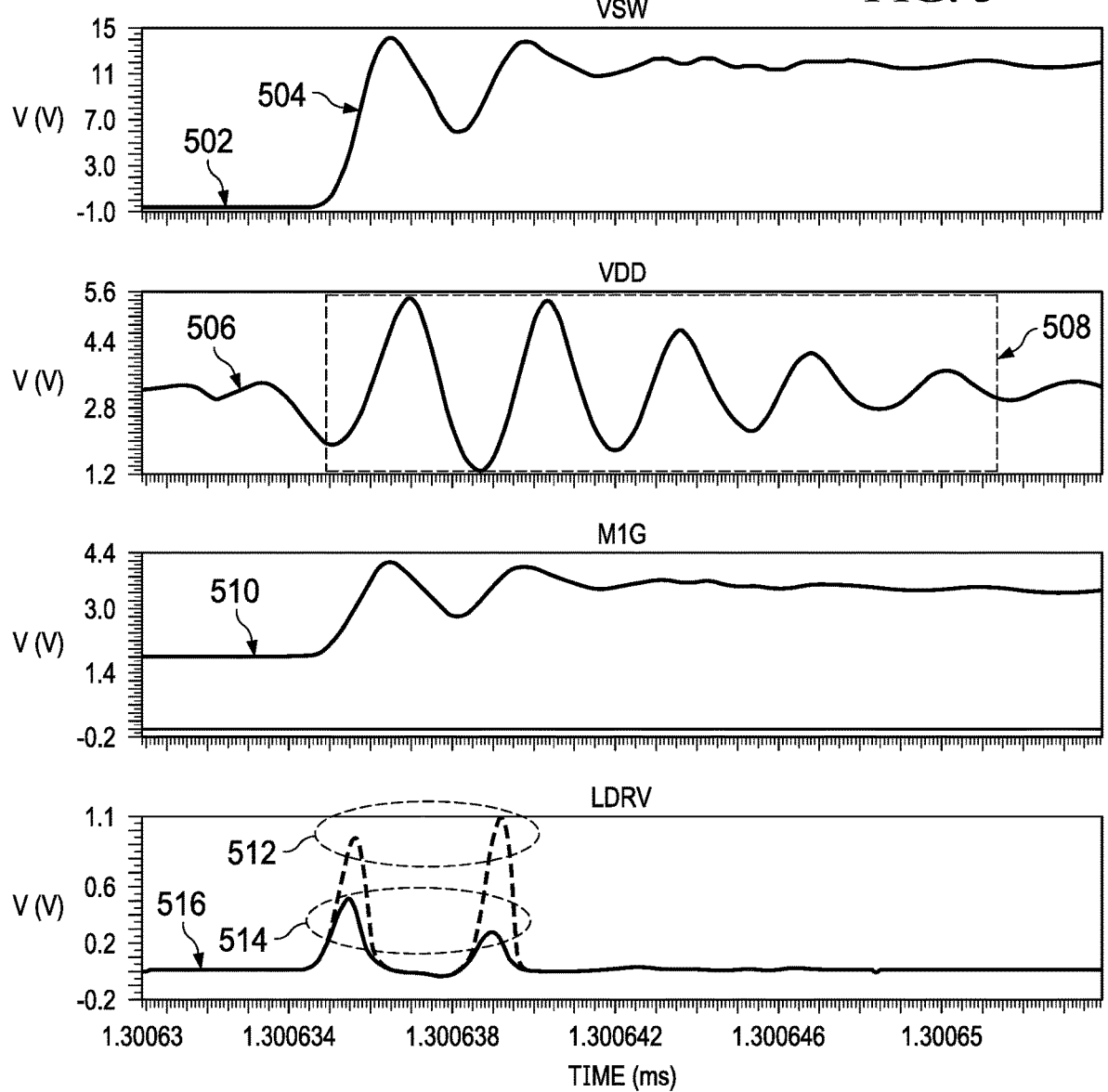
FIG. 5 shows a comparison of transients on a low-side power transistor drive signal with and without a hybrid gate driver circuit as described herein.

FIG. 5 shows a comparison of transients on a low-side power transistor drive signal with and without the hybrid gate driver circuit 208. FIG. 5 shows the signal 502 at the switching node 210, the power supply voltage 506 that powers the hybrid gate driver circuit 208, and the signal 510 at the gate terminal 218G of the pull-down transistor 218. When the high-side power transistor 202 is activated, the signal 502 rises at edge 504. Switching of the high-side power transistor 202 induces noise 508 on the power supply voltage 506. The noise 508 causes the voltage of the power supply voltage 506 to drop. The drop in the voltage of the power supply voltage 506 can be fairly large (e.g., about 2 volts with nominal 3.3 volt power supply). The noise on the power supply voltage 506 reduces the voltage at the gate terminal 218G of the pull-down transistor 218, which increases the resistance of the pull-down transistor 218 making the low-side power transistor 206 more susceptible to activation via the drain-gate capacitance of the low-side power transistor 206.

In a conventional gate driver circuit, the noise on the power supply voltage 506 produces transients 512 at the gate terminal 206G of the transistor 206. The voltage of the transients 512 may exceed the threshold voltage of the low-side power transistor 206 and activate the low-side power transistor 206 in some switch-mode power supplies. In contrast, the voltage of the transients 514 generated on the drive signal 516 in the hybrid gate driver circuit 208 is substantially lower than that of the transients 512. The voltage of the transients 514 generated in the hybrid gate driver circuit 208 is below the threshold voltage of the low-side power transistor 206 thereby preventing the low-side power transistor 206 from turning on.

Figure 6:
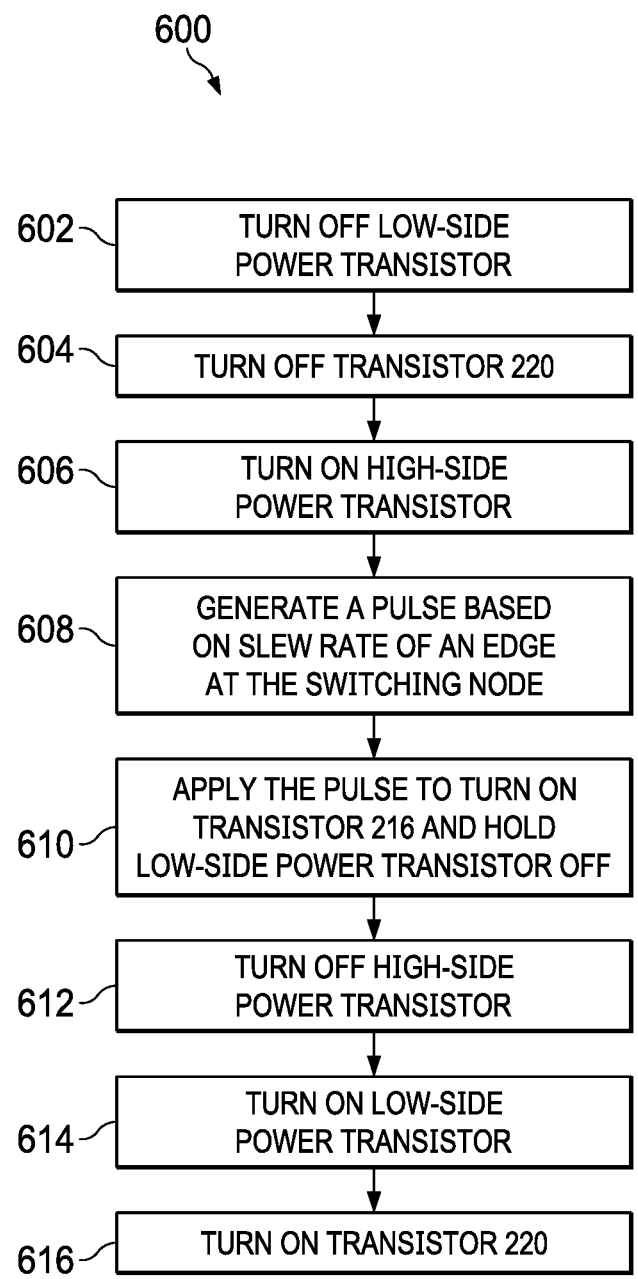
FIG. 6 shows a flow diagram for a method for driving a low-side power transistor in a switch-mode power supply as described herein.

FIG. 6 shows a flow diagram for a method 600 for driving a low-side power transistor in a switch-mode power supply as described herein. Though depicted sequentially as a matter of convenience, at least some of the actions shown can be performed in a different order and/or performed in parallel. Additionally, some implementations may perform only some of the actions shown. Operations of the method 600 may be performed by an implementation of the switch-mode power supply 200.

In block 602, the low-side power transistor 206 turns off to disconnect the switching node 210 from ground.

In block 604, the transistor 220 is turned off. The transistor 220 is turned off in conjunction with turning off the low-side power transistor 206. Turning off the transistor 220 enables turn on of the transistor 216.

In block 606, the high-side power transistor 202 is turned on to connect the switching node 210 to $V_{IN}$. Turning on the high-side power transistor 202 produces the edge 304 (FIG. 3) at the switching node 210.

In block 608, the slew rate monitoring circuit 214 generates a pulse 316 (FIG. 3) based on the slew rate of the edge 304 at the switching node 210. The amplitude of the pulse 316 is a function of the slew rate of the edge 304.

In block 610, the pulse 316 is applied at the gate terminal 216G of the transistor 216 to turn on the transistor 216 and hold the low-side power transistor 206 off. Thus, the slew rate monitoring circuit 214 and the transistor 216 operate to prevent the low-side power transistor 206 from turning on due to noise created by the edge 304.

In block 612, the high-side power transistor 202 is turned off to disconnect the switching node 210 from $V_{IN}$.

In block 614, the low-side power transistor 206 is turned on to connect the switching node 210 to ground.

In block 616, the transistor 220 is turned on, in conjunction with turn off of the low-side power transistor 206. Turning on the transistor 216 prevents turn on of the transistor 216 while the low-side power transistor 206 is on.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A hybrid gate driver circuit, comprising: a transistor having first, second and third transistor terminals, the first transistor terminal couple to a transistor drive terminal, and the second transistor terminal coupled to a ground terminal;
   a slew rate monitoring circuit coupled to the transistor and to a switching terminal, the slew rate monitoring circuit configured to control the transistor responsive to a slew rate of a signal at the switching terminal;
   a capacitor having first and second capacitor terminals, the first capacitor terminal coupled to the switching terminal, and the second capacitor terminal coupled to the third capacitor terminal; and
   a clamp circuit having first and second clamp terminals, the first claim terminal coupled to the second capacitor terminal, and the second clamp terminal coupled to a ground terminal.

2. The hybrid gate driver circuit of claim 1, wherein:
   the transistor is a first transistor; and
   the hybrid gate driver circuit further comprising a second transistor having fourth, fifth and sixth transistor terminals, the fourth transistor terminal coupled to the transistor drive terminal, the fifth transistor terminal coupled to the ground terminal, and the sixth transistor terminal coupled to a pulse width modulation input terminal.

3. The hybrid gate driver circuit of claim 2, wherein the second transistor is configured to deactivate a low-side power field effect transistor (FET) coupled to the switching terminal.

4. The hybrid gate driver circuit of claim 1, further comprising:
   a resistor coupled between the second capacitor terminal and the ground terminal.

5. The hybrid gate driver circuit of claim 1, wherein the clamp circuit is configured to limit a voltage at a control terminal of the transistor.

6. The hybrid gate driver circuit of claim 1, wherein:
   the transistor is a first transistor; and
   the hybrid gate driver circuit further comprising a second transistor having fourth, fifth and sixth transistor terminals, the fourth transistor terminal coupled to the second capacitor terminal, the fifth transistor terminal coupled to the ground terminal, and the sixth transistor terminal coupled to a pulse width modulation terminal.

7. The hybrid gate driver circuit of claim 6, wherein the second transistor is configured to deactivate the first transistor responsive to a pulse width modulator signal.

8. The hybrid gate driver circuit of claim 1, wherein:
   the transistor is a first transistor; and
   the hybrid gate driver circuit further comprising a second transistor having fourth, fifth and sixth transistor terminals, the fourth transistor terminal coupled to the transistor drive terminal, the fifth transistor terminal coupled to a power supply terminal, and the sixth transistor terminal coupled to a pulse width modulation input terminal.

9. The hybrid gate driver circuit of claim 8, wherein the second transistor is configured to activate a low-side power field effect transistor (FET) coupled to the switching terminal.

10. The hybrid gate driver circuit of claim 1, wherein:
    the transistor is configured to deactivate a low-side power field effect transistor (FET) coupled to the switching terminal; and
    the capacitor is part of a slew rate monitoring circuit configured to activate the transistor based on a slew rate of a signal at the switching terminal.

11. A switch-mode power supply circuit, comprising:
    a low-side power field effect transistor (FET) having first, second and third FET terminals, the first FET terminal coupled to a switching node, the second FET terminal coupled to a ground terminal; and
    a hybrid gate driver circuit configured to control activation of the low-side power FET based on a pulse width modulation signal, the hybrid gate driver circuit including:
       a transistor coupled to the third FET terminal and the switching terminal, the transistor configured to deactivate the low-side power FET responsive to a slew rate of a signal at the switching terminal;
       a slew rate monitoring circuit coupled to the switching terminal and the transistor, and configured to activate the transistor based on the slew rate of the signal at the switching terminal; and
       a clamp circuit configured to limit a voltage at a control terminal of the transistor.

12. The switch-mode power supply circuit of claim 11, wherein:
    the transistor is a first transistor; and
    the hybrid gate driver circuit further includes a second transistor coupled to the first transistor, and configured to deactivate the first transistor based on a pulse width modulator signal.

13. The switch-mode power supply circuit of claim 11, wherein the slew rate monitoring circuit includes a capacitor coupled between the switching terminal and the control terminal of the transistor.

14. The switch-mode power supply circuit of claim 13, wherein the slew rate monitoring circuit includes a resistor coupled between the capacitor and the ground terminal.

15. A method comprising:
    turning off a low-side power transistor;
    turning on a high-side power transistor;
    monitoring a slew rate of a signal at a switching node of a switch-mode power supply using a circuit that includes a capacitor that is coupled between the switching node and a control terminal of a first transistor and a resistor coupled between the control terminal of the first transistor and a ground terminal;

generating a pulse based on a slew rate of a signal at a switching node of a switch-mode power supply; and applying the pulse to turn on the first transistor to hold the low-side power transistor off.

16. The method of claim 15, further comprising turning off a second transistor in conjunction with turning off the low-side power transistor to enable turn on of the first transistor.

17. The method of claim 16, further comprising:

turning off the high-side power transistor;

turning on the low-side power transistor; and turning off the second transistor in conjunction with turning on the low-side power transistor to disable turn on of the first transistor.

\* \* \* \* \*